United States Patent
Wang et al.

(10) Patent No.: US 10,371,081 B2
(45) Date of Patent: Aug. 6, 2019

(54) SYSTEM AND METHODS FOR ADAPTIVELY DETERMINING TURBOCHARGER SPEED

(71) Applicant: HONEYWELL INTERNATIONAL INC., Morris Plains, NJ (US)

(72) Inventors: Haibin Wang, Shanghai (CN); Gaofeng Liu, Shanghai (CN); Yuguo Liu, Shanghai (CN); Longfei Chen, Shanghai (CN); Du You, Shanghai (CN); Guihua Chen, Shanghai (CN); Yunbin Gong, Shanghai (CN); Xiaowei Du, Shanghai (CN)

(73) Assignee: Garrett Transportation I Inc., Torrance, CA (US)

( * ) Notice: Subject to any disclaimer, the term of this patent is extended or adjusted under 35 U.S.C. 154(b) by 262 days.

(21) Appl. No.: 15/584,783

(22) Filed: May 2, 2017

(65) Prior Publication Data

US 2018/0320623 A1   Nov. 8, 2018

(51) Int. Cl.
*F02D 41/26* (2006.01)
*F02D 41/10* (2006.01)
(Continued)

(52) U.S. Cl.
CPC .............. *F02D 41/26* (2013.01); *F02D 41/10* (2013.01); *F02D 41/18* (2013.01); *G01P 3/44* (2013.01);
(Continued)

(58) Field of Classification Search
CPC .......... F02D 41/26; F02D 41/10; F02D 41/18; G01P 3/44; G01P 3/48; H04R 1/028; H04R 2201/003
See application file for complete search history.

(56) References Cited

U.S. PATENT DOCUMENTS 6,298,728 B1   10/2001  Fekete et al.
8,628,452 B2 *  1/2014  Nemeth ............... B60W 10/06
                                                    477/107
(Continued)

FOREIGN PATENT DOCUMENTS

EP        0863404 A1    9/1998

OTHER PUBLICATIONS

Kleeman, L.; Understanding and Applying Kalman Filtering, Proceedings of the Second Workshop on Perceptive Systems, Curtin University of Technology, Perth Western Australia (Jan. 25-26, 1996).

(Continued)

*Primary Examiner* — Hieu T Vo
(74) *Attorney, Agent, or Firm* — Lorenz & Kopf, LLP (57) ABSTRACT

Turbocharger systems and related methods and devices are provided for determining rotational speed of a turbocharger. A speed sensing device is mounted to a turbocharger and includes an acceleration sensing arrangement and an acoustic sensing arrangement. The speed sensing device outputs an acceleration-based speed value as the current turbo speed when the acceleration-based speed is stable, and otherwise outputs an acoustic-based speed value to as the current turbo speed if the acoustic-based speed value stable or outputs an estimated value as the current turbo speed when both of the acceleration-based and acoustic-based speeds are unstable. In exemplary embodiments, the acceleration sensing arrangement and the acoustic sensing arrangement are provided on a common substrate.

20 Claims, 6 Drawing Sheets

(51) Int. Cl.
| | |
|---|---|
| *F02D 41/18* | (2006.01) |
| *G01P 3/44* | (2006.01) |
| *G01P 3/48* | (2006.01) |
| G01P 15/00 | (2006.01) |
| H04R 1/02 | (2006.01) |

(52) U.S. Cl.
CPC ........ *G01P 3/48* (2013.01); *B81B 2201/0257* (2013.01); *G01P 15/00* (2013.01); *H04R 1/028* (2013.01); *H04R 2201/003* (2013.01)

(56) References Cited

U.S. PATENT DOCUMENTS

| | | | |
|---|---|---|---|
| 9,488,124 B2* | 11/2016 | Kawabe | .................. F02B 37/00 |
| 2014/0107905 A1 | 4/2014 | Kassner | |
| 2018/0355876 A1* | 12/2018 | Sase | ........................ F02B 39/16 |

OTHER PUBLICATIONS

European Patent and Trademark Office, European Extended Search Report for Application No. 18169381.3 dated Oct. 16, 2018.
David Moro, et al, Upgrade of a Turbocharger Speed Measurement Algorithm Based on Acoustic Emission, 2009, Bologna, Italy.
Fabrizio Ponti, et al, Non-Intrusive Methodology for Estimation of Speed Fluctuations in Automotive Turbochargers under Unsteady Flow Conditions, Apr. 1, 2014, Italy.
N. Artetakis, et al, Turbocharger Unstable Operation Diagnosis Using Vibroacoustic Measurements, 2003, Athens, Greece.
Domenico Crescenzo, et al, Turbocharger Speed Estimation via Vibration Analysis, Apr. 5, 2016, Stockholm, Sweden.

\* cited by examiner

SYSTEM AND METHODS FOR ADAPTIVELY DETERMINING TURBOCHARGER SPEED

TECHNICAL FIELD

The subject matter described herein relates generally to turbomachines, and more particularly, relates to adaptively determining the rotational speed of a turbine or compressor using a combination of different sensors.

BACKGROUND

Turbocharger systems are frequently used to improve the efficiency of internal combustion engines. Monitoring or diagnosing the performance of a turbocharger often involves measuring the rotational speed of the turbocharger. However, speed sensors can be relatively expensive and size, packaging, assembly, or installation constraints can be prohibitive. For example, some speed sensors require drilling a hole on a contoured surface of a compressor housing. While acceleration sensors have been proposed for measuring rotational speed based on a proportional relationship, the accuracy and reliability of the measurement suffers as rotational speed increases. Accordingly, it is desirable to provide a means for determining rotational speed of a turbocharger in a manner that is accurate and reliable over the turbocharger speed range while minimizing cost and packaging and/or installation constraints.

BRIEF SUMMARY

Methods and systems are provided for determining a rotational speed associated with a turbocharger. One exemplary system includes a turbocharger arrangement and a speed sensing device mounted to the turbocharger arrangement. The speed sensing device includes an acceleration sensing arrangement, an acoustic sensing arrangement, a communications interface to output a current speed value, and a control module coupled to the acceleration sensing arrangement, the acoustic sensing arrangement and the communications interface. The control module provides an acceleration speed value to the communications interface as the current speed value when the acceleration speed value is stable, provides an acoustic speed value to the communications interface as the current speed value when the acceleration speed value is unstable and the acoustic speed value is stable, and provides an estimated speed value to the communications interface as the current speed value when both the acceleration speed value and the acoustic speed value are unstable.

In one embodiment, an apparatus for a speed sensing device is provided. The speed sensing device includes a substrate, an acceleration sensing arrangement on the substrate to output measured acceleration output signals, an acoustic sensing arrangement on the substrate to output measured acoustic output signals, a communications interface, and a control module coupled to the acceleration sensing arrangement, the acoustic sensing arrangement and the communications interface to determine an acceleration speed value based at least in part on the measured acceleration output signals, determine an acoustic speed value based at least in part on the measured acoustic output signals, provide the acceleration speed value to the communications interface for output as a current speed value when the acceleration speed value is stable, provide the acoustic speed value to the communications interface for output as the current speed value when the acceleration speed value is unstable and the acoustic speed value is stable, and provide an estimated speed value to the communications interface for output as the current speed value when both the acceleration speed value and the acoustic speed value are unstable.

In another embodiment, a method for determining a rotational speed associated with a turbocharger involves determining a first speed value based on first output signals from an acceleration sensing arrangement of a device mounted to the turbocharger, determining a second speed value based on second output signals from an acoustic sensing arrangement of the device, outputting the first speed value as the rotational speed when the first speed value is stable, and when the first speed value is unstable, outputting the second speed value as the rotational speed when the second speed value is stable or outputting an estimated value as the rotational speed when both the first and second speed values are unstable.

BRIEF DESCRIPTION OF THE DRAWINGS

Embodiments of the subject matter will hereinafter be described in conjunction with the following drawing figures, wherein like numerals denote like elements, and.

DETAILED DESCRIPTION

Embodiments of the subject matter described herein relate to adaptively determining a speed metric associated with a turbocharger, such as, for example, a rotational speed of a turbine wheel. While the speed metric may be described herein in the context of a rotational speed of a turbine wheel for purposes of explanation, it should be appreciated that the subject matter is not necessarily limited to the rotational speed of a turbine wheel, and in practice, the speed metric could be realized as the rotational speed of a compressor wheel, a rotary shaft coupling a turbine wheel to a compressor wheel, or another rotating component of a turbocharger assembly. Similarly, the subject matter is not necessarily limited to a rotational speed or angular velocity, and may be utilized to determine values for other metrics that are influenced by or correlative to the rotational speed, such as a rotational acceleration. For purposes of explanation, but without limitation, "turbo speed" or variants thereof may be utilized herein to refer to the rotational speed associated with the turbine or another rotating component of a turbocharger assembly.

As described in greater detail below, the current value for the turbo speed is adaptively determined based on the outputs of different sensing arrangements based on their relative stabilities. For example, a speed metric determined based on output signals from an acceleration sensing arrangement (or acceleration sensor or accelerometer) may be set as the current turbo speed when the acceleration-based speed value is relatively stable based on one or more preceding acceleration-based speed values. When the current acceleration-based speed value is not sufficiently stable, a speed metric determined based on output signals from an acoustic sensing arrangement (or microphone) may be set as the current turbo speed when the acoustic-based speed value is relatively stable based on one or more preceding acoustic-based speed values. When neither of the current acceleration-based speed value or the current acoustic-based speed value is stable, an estimated speed value is determined based at least in part on a preceding speed value for whichever of the acceleration-based speed value and the acoustic-based speed value is most stable. Thus, for turbine speed ranges or other operating conditions where the sensor outputs may be unstable, the estimated speed can provide a more reliable measurement value for the current turbine speed. In practice, the acceleration-based speed values are relatively stable and reliable at lower turbine speeds (e.g., less than a particular frequency) and the acoustic-based speed values are relatively stable and reliable at higher turbine speeds (e.g., greater than a particular frequency), with the estimated speed value providing a reliable transition as the turbine speed fluctuates between reliable speed ranges for the sensor-based speed values. In exemplary embodiments, the sensor output signals are also adaptively filtered based on the previously determined turbo speed values, thereby improving the efficiency and accuracy when determining a current speed value based on the sensor output signals.

In exemplary embodiments, the different sensing arrangements are mounted or otherwise provided on a common support structure or substrate, which, in turn is mounted on the turbocharger assembly. In one or more embodiments, the substrate also supports a control module that receives and processes the output signals from the sensing arrangement along with a wireless communications interface that may be utilized to communicate the current turbo speed value determined by the control module to an external computing device outside of the engine compartment. For example, the different sensing arrangements, the control module, and the wireless communications interface may be packaged or contained in a common device housing or package, which is then mounted on a component of the turbocharger. In one or more embodiments, one or more additional auxiliary sensing arrangements may also be utilized to detect an environmental condition during which one of the sensors should not be utilized for purposes of determining the turbo speed. For example, a temperature sensing arrangement may also be provided on the substrate or otherwise incorporated with the turbo speed sensing device to measure a temperature of the other sensing arrangements for purposes of detecting when the temperature violates an acceptable operating range for a sensing arrangement.

It should be noted that although the subject matter may be described herein primarily in the context of acceleration and acoustic sensing arrangements, the subject matter described herein is not intended to be limited to any particular type, number, or combination of sensing arrangements that may be utilized for determining the turbo speed. For example, output signals from additional sensing arrangements could be utilized to determine another sensor-based speed value, which may be selectively utilized as the current turbo speed (or as the basis for an estimated turbo speed) based on its stability or reliability relative to other speed values (e.g., acceleration-based, acoustic-based, and the like). Similarly, although the subject matter may be described herein primarily in the context of temperature sensing arrangement for detecting an environmental condition when a particular sensor-based speed should not be utilized, the subject matter described herein is not intended to be limited to any particular type, number, or combination of sensing arrangements that may be utilized for detecting environmental conditions for selectively excluding a particular sensor-based speed from consideration.

Figure 1:
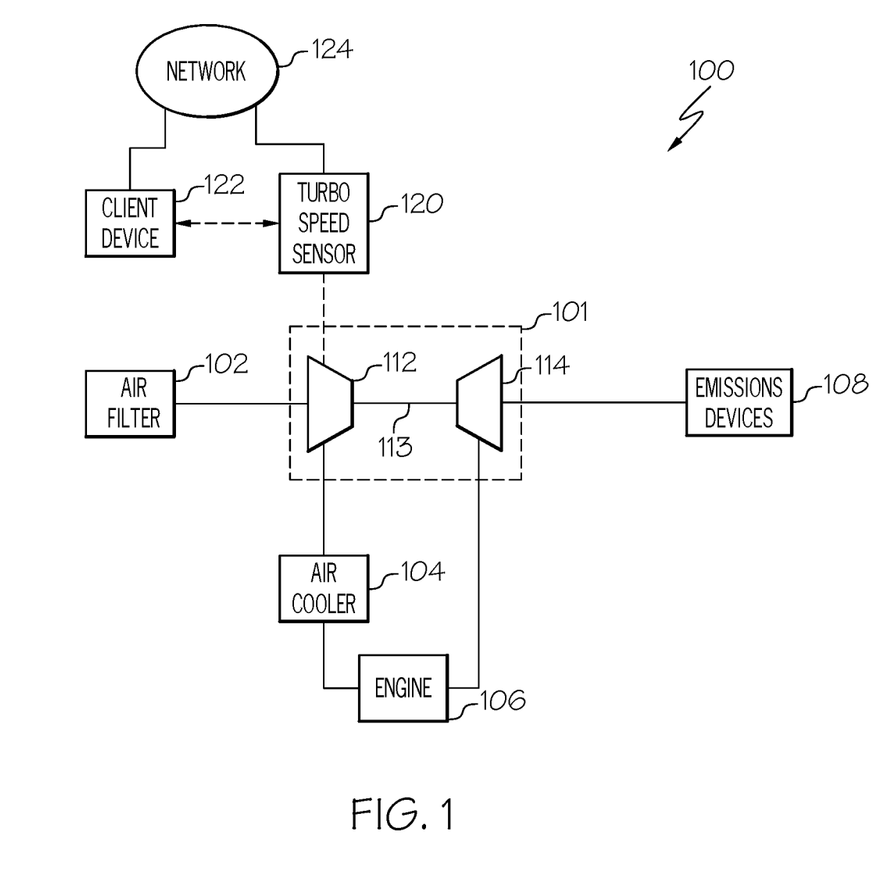
FIG. 1 depicts a block diagram of a turbocharger system in an exemplary embodiment.

FIG. 1 depicts an exemplary embodiment of a turbocharger system 100 that includes a turbocharger arrangement 101 configured to increase the efficiency of an engine 106, which may be designed for and utilized with any sort of vehicle, such as, for example, heavy-duty or performance automotive vehicles to light-duty automotive vehicles. The turbocharger 101 includes a compressor 112 having an inlet arranged to receive ambient air downstream of an air filter 102, and the compressor 112 performs compression to provide charge air for the cylinders of the vehicle engine 106. The illustrated embodiment includes a charge air cooler 104 that receives the pressurized intake air stream from the compressor 112 and dissipates heat from the pressurized air stream, increasing its density, with the resulting cooled and pressurized air stream being provided to an intake manifold of the engine 106, which may be, for example, an internal combustion engine.

The turbocharger 101 also includes a turbine 114 having a turbine wheel that is mounted or otherwise coupled to the wheel (or impeller) of the compressor 112 via a common rotary shaft 113, so that the turbine wheel and the compressor wheel (and the shaft 113) rotate substantially in unison at substantially the same rotational speed. In this regard, in some embodiments, the turbine 114 is coaxially and concentrically aligned with the compressor 112. The inlet of the turbine 114 receives exhaust gas from the engine 106, and exhaust gas flow from the outlet of the turbine 114 is provide to one or more downstream emissions devices 108, such as, for example, a catalytic converter or similar emissions control device.

In the embodiment of FIG. 1, the turbocharger system 100 includes a device 120 configured to measure or otherwise determine the current rotational speed metric associated with the turbocharger 101, which may alternatively be referred to herein as a turbo speed sensor for purposes of explanation. In this regard, the turbo speed sensor 120 outputs or otherwise provides a current value that is representative of the rate of rotation of any one of the compressor wheel, the turbine wheel, or the shaft 113. In exemplary embodiments, the turbo speed sensor 120 is mounted or otherwise affixed to the housing of the compressor 112, however, in alternative embodiments, the turbo speed sensor 120 may be mounted on an actuator or some other element or feature of the turbocharger arrangement 101. That said, for purposes of explanation, the subject matter may be described herein in the context of the turbo speed sensor 120 being mounted on the compressor housing.

In exemplary embodiments, the turbo speed sensor 120 includes a communications interface configured to support communications with a client computing device 122 over a wireless communications network 124. Depending on the embodiment, the wireless network 124 may be realized as an ad hoc wireless network, a Bluetooth network, a personal area network (PAN), a wireless local area network (WLAN), a cellular network, or another suitable wireless network. The client computing device 122 generally represents an electronic device that may be utilized by a user to communicate with the turbo speed sensor 120 and retrieve turbine speed values from the turbo speed sensor 120 via the network 124. In practice, the client device 122 can be realized as any sort of personal computer, mobile telephone, tablet or other network-enabled electronic device. In exemplary embodiments, the client device 122 includes at least a display device, such as a monitor, screen, or another conventional electronic display, capable of graphically presenting data and/or information provided by the turbo speed sensor 120 along with a user input device, such as a touchscreen, a touch panel, a key pad, a keyboard, a directional pad, or the like, capable of receiving input from the user of the client device 122. In some embodiments, the client device 122 executes a client application that communicates with the turbo speed sensor 120, which in some embodiments could be realized as a web browser or similar application that contacts turbo speed sensor 120 using a suitable networking protocol.

Figure 2:
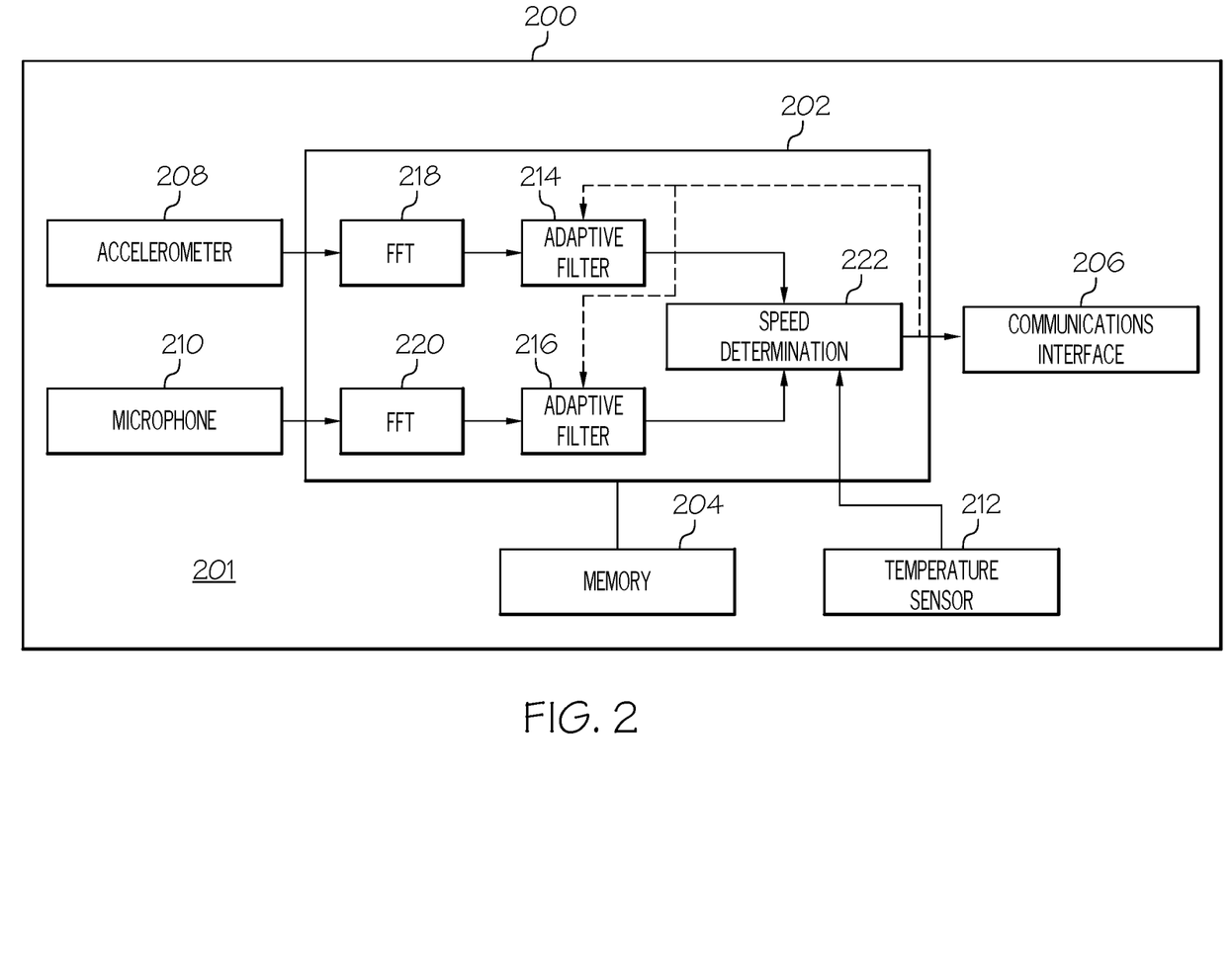
FIG. 2 depicts a block diagram of a device suitable for use as a turbo speed sensing device in the turbocharger system of FIG. 1 in an exemplary embodiment.

FIG. 2 depicts an exemplary embodiment of an electronic device 200 suitable for use as the turbo speed sensor 120 in the turbocharger system 100 of FIG. 1. The illustrated device 200 includes, without limitation, a control module 202, a data storage element 204 (or memory), a communications interface 206, and a plurality of different sensing arrangements 208, 210, 212. In exemplary embodiments, the control module 202, the memory 204, the communications interface 206, and the sensing arrangements 208, 210, 212 are encapsulated or otherwise contained within a common housing or device package. In this regard, in one or more embodiments, the components 202, 204, 206, 208, 210, 212 of the device 200 are all formed or otherwise provided on a common substrate or support structure 201 for the device 200, such as, for example, a printed circuit board or similar electronics substrate, a lead frame or die pad, or the like. In one or more exemplary embodiments, the device substrate 201 is mounted or otherwise affixed to the housing of the compressor 112, so that rotational forces are transferred from the compressor housing to the substrate 201, which, in turn enables measurement of the rotational speed of the turbocharger 101 via an acceleration sensing arrangement 208.

In exemplary embodiments, the acceleration sensing arrangement 208 is realized as a microelectromechanical system (MEMS) type of accelerometer that is formed or otherwise fabricated on a semiconductor substrate, which, depending on the embodiment, could be substrate 201 or a different substrate that is then affixed or otherwise mounted to the device substrate 201. That said, it should be appreciated that the subject matter described herein is not limited to any particular type of acceleration sensing arrangement 208. For purposes of explanation, the acceleration sensing arrangement 208 may alternatively be referred to herein as an accelerometer, or more particularly, a MEMS accelerometer.

The illustrated device 200 also includes an acoustic sensing arrangement 210 (or microphone) that is also provided on the device substrate 201. In one or more embodiments, the acoustic sensing arrangement 210 is also realized as a microelectromechanical system (MEMS) type microphone that is formed or otherwise fabricated on a semiconductor substrate, which, depending on the embodiment, could be the device substrate 201 or a different substrate that is then affixed or otherwise mounted to the device substrate 201. In this regard, in some embodiments, the acoustic sensing arrangement 210 and the acceleration sensing arrangement 208 may be fabricated on a common semiconductor substrate that is then provided on the substrate 201. Again, it should be appreciated that the subject matter described herein is not limited to any particular type of acoustic sensing arrangement 210. For purposes of explanation, the acoustic sensing arrangement 210 may alternatively be referred to herein as a microphone, or more particularly, a MEMS microphone. As described in greater detail below, the microphone 210 outputs electrical signals representative of a sensed acoustic signal (or sound or sound pressure level) that have frequency characteristics correlative or otherwise corresponding to the rate of rotation associated with the turbocharger 101.

In one or more embodiments, the device 200 also includes one or more additional sensing arrangements 212 for sensing or otherwise measuring environmental conditions experienced by the device 200 or the other sensing arrangements 208, 210 utilized to measure the turbo speed. For example, in exemplary embodiments, the device 200 includes a temperature sensing arrangement 212 configured to measure a temperature of the device 200 and/or substrate 201, which, in turn may be utilized to detect a temperature at which one of the other sensing arrangements 208, 210 may be unreliable. Depending on the embodiment, the temperature sensing arrangement 212 could be fabricated or formed on the device substrate 201 or a different substrate that is then affixed or otherwise mounted to the device substrate 201. In this regard, in some embodiments, the temperature sensing arrangement 212 may be fabricated on a semiconductor substrate that is shared in common with one or more of the other sensing arrangements 208, 210. Again, it should be appreciated that the subject matter described herein is not limited to any particular type or number of environmental sensing arrangements 212, and in practice, additional or different environmental sensing arrangements 212 may be utilized to detect or identify any number of environmental conditions which may impact performance of one of the sensing arrangements 208, 210.

Still referring to FIG. 2, the communications interface 206 generally represents the hardware, circuitry, logic, firmware and/or other components configured to support wireless communications to/from the device 200, and may include, for example, one or more transmitters, receivers, transceivers, and the like. In this regard, depending on the embodiment, the communications interface 206 could be realized as a cellular transceiver, a wireless adapter, a Bluetooth adapter, or other wireless communications module that supports communications with a client device 122 via the network 124.

The control module 202 generally represents the hardware, circuitry, processing logic, firmware and/or other components of the device 200 coupled to the sensing arrangements 208, 210, 212 and the communications interface 206 and configured to support determining and outputting a current turbo speed measurement value, as described in greater detail below. In exemplary embodiments, the control module 202 is realized as a microcontroller, however, in alternative embodiments, the control module 202 may be realized as any sort of general purpose processor, controller, microprocessor, content addressable memory, digital signal processor, application specific integrated circuit, field programmable gate array, any suitable programmable logic device, discrete gate or transistor logic, processing core, discrete hardware components, or any combination thereof, designed to perform the functions described herein. The steps of a method or algorithm described in connection with the embodiments described herein may be embodied directly in hardware, in firmware, in a software module executed by the control module 202, or in any practical combination thereof.

In accordance with one or more embodiments, the control module 202 includes or otherwise accesses the data storage element 204, such as a memory, one or more registers, or another suitable non-transitory short or long term computer-readable storage media, which is capable of storing computer-executable programming instructions or other data for execution by the control module 202. In exemplary embodiments, the instructions, when read and executed by the control module 202, cause the control module 202 to generate or otherwise implement filtering modules 214, 216, fast Fourier transform (FFT) modules 218, 220, and a speed determination module 222 configured to execute and perform one or more of the processes tasks, operations, and/or functions described herein.

As described in greater detail below in the context of FIG. 3, the FFT modules 218, 220 sample the output signals from the respective sensing arrangements 208, 210 and convert the output signals into a corresponding representation of the measurement signals in the frequency domain (or spectral representation). The filtering modules 214, 216 receive the output signals from the FFT modules 218, 220 and bandpass filter the measurement signals using a pass band that corresponds to a range of frequencies that is likely to encompass the rotational speed of the turbocharger 101. In exemplary embodiments, the filtering modules 214, 216 implement an adaptive band pass filter having a pass band that is centered about one or more previously determined turbo speeds and a bandwidth that is influenced by the maximum turbo speed for the turbocharger 101. The filtered measurement signals from the filtering modules 214, 216 are provided to the speed determination module 222, which, in turn, analyzes the filtered measurement signals to identify a peak frequency associated with the filtered measurement signals, that is, the frequency component of the filtered measurement signals having the greatest amplitude. In this regard, the frequency component of the filtered measurement signal having the greatest amplitude corresponds to the respective measurement of the current rotational speed of the turbocharger 101 by the respective sensing arrangement 208, 210. Accordingly, the peak frequency component of the filtered accelerometer signals output by the filtering module 214 corresponds to the acceleration-based measurement of the current turbo speed and may alternatively be referred to herein as the accelerometer turbo speed value. Similarly, the peak frequency component of the filtered acoustic signals output by the filtering module 216 corresponds to the acoustic-based measurement of the current turbo speed and may alternatively be referred to herein as the microphone turbo speed value.

As described in greater detail below in the context of FIG. 4, the speed determination module 222 after determining the current accelerometer turbo speed value and the current microphone turbo speed value, the speed determination module 222 determines the current turbo speed value for outputting via the communications interface 206 based on the currently measured turbo speed values relative to the previous turbo speed values determined using those respective sensing arrangements 208, 210. Additionally, in one or more embodiments, the speed determination module 222 receives output from any other sensing arrangements 212 of the device 200 to detect environmental conditions when one of the accelerometer or microphone speed values should be excluded from consideration as the current turbo speed value in response to detecting an environmental condition indicative of a respective sensing arrangement 208, 210 being unreliable or operated outside of its operating range for the particular environmental condition.

Figure 3:
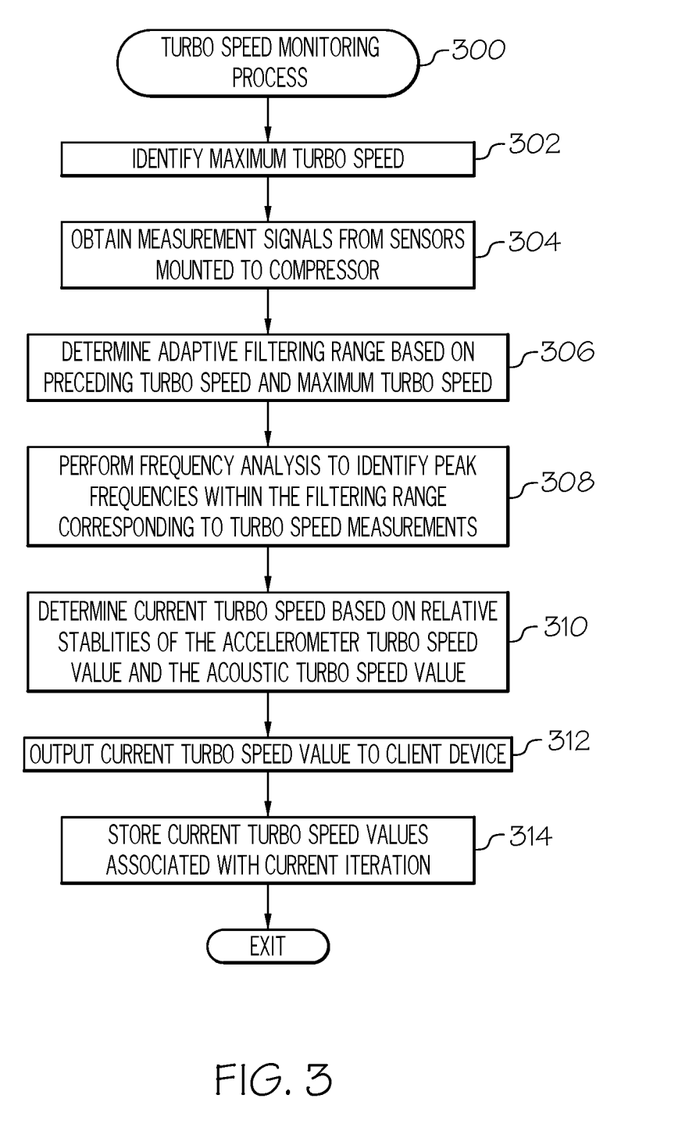
FIG. 3 is a flow diagram of an exemplary turbo speed monitoring process suitable for implementation with the turbocharger system of FIG. 1 in accordance with one or more exemplary embodiments.

Referring now to FIG. 3, and with continued reference to FIGS. 1-2, in an exemplary embodiment, a turbo speed sensor 120, 200 in a turbocharger system 100 is configured to perform a turbo speed monitoring process 300 and additional tasks, functions, and operations described below to determine a current measurement representative of the current rotational speed associated with a turbocharger 101. The various tasks performed in connection with the illustrated process 300 may be implemented using hardware, firmware, software executed by processing circuitry, or any combination thereof. For illustrative purposes, the following description may refer to elements mentioned above in connection with FIGS. 1-2. In practice, portions of the turbo speed monitoring process 300 may be performed by different elements of a turbocharger system 100. That said, in exemplary embodiments, the turbo speed monitoring process 300 is implemented by the turbo speed sensor 120, 200. It should be appreciated that practical embodiments of the turbo speed monitoring process 300 may include any number of additional or alternative tasks, the tasks need not be performed in the illustrated order and/or the tasks may be performed concurrently, and/or the turbo speed monitoring process 300 may be incorporated into a more comprehensive procedure or process having additional functionality not described in detail herein. Moreover, one or more of the tasks shown and described in the context of FIG. 3 could be omitted from a practical embodiment of the turbo speed monitoring process 300 as long as the intended overall functionality remains intact.

In exemplary embodiments, the turbo speed monitoring process 300 begins by identifying or otherwise obtaining a maximum turbo speed value for use in configuring the filters for the output signals from the sensing arrangements (task 302). For example, in one or more embodiments, the maximum turbo speed value for the turbocharger 101 is input or otherwise provided by a user of the client device 122, which, in turn transmits or otherwise provides the maximum turbo speed value to the turbo speed sensor 120, 200. In response to receiving the maximum turbo speed value from the client device 122, the control module 202 may store or otherwise maintain the maximum turbo speed value in memory 204. That said, in the absence of an input maximum turbo speed value, the memory 204 may store or otherwise maintain a default maximum turbo speed value for reference by the control module 202 during subsequent operation.

The turbo speed monitoring process 300 continues by receiving or otherwise obtaining raw measurement signals from sensing arrangements mechanically coupled to the turbocharger and adaptively filtering the measurement signals based at least in part on one or more of the preceding turbo speed value and the maximum turbo speed value (tasks 304, 306). In this regard, the control module 202 may periodically sample the outputs of the sensing arrangements 208, 210 with a particular sampling frequency to obtain raw measurement samples that are processed by the FFT modules 218, 220 to obtain spectral representations of the measurement signals output by the sensing arrangements 208, 210. In one or more embodiments, the sensing arrangements 208, 210 are sampled substantially synchronously and with the same sampling frequency so that the sampling times associated with the measurement samples from the respective sensing arrangements 208, 210 are substantially contemporaneous with one another. The sampling frequency may also be calculated or otherwise determined based on the maximum turbo speed value (e.g., at least twice the maximum turbo speed value). In one exemplary embodiment, the sensing arrangements 208, 210 are sampled at a frequency of about 51.2 kHz and the FFT modules 218, 220 implement a block size of 4096 to achieve a speed resolution of about 12.5 Hz. The filtering modules 214, 216 band pass filter the measurement signals to obtain filtered measurement signals that exclude frequency components outside of the filter pass band.

In exemplary embodiments, the control module 202 configures the filtering modules 214, 216 to have a pass band bandwidth that is a fraction of the maximum turbo speed value (e.g., 25% of the maximum turbo speed value). In this regard, limiting the pass band bandwidth may mitigate the impact of resonance, noise, and the like on the determined turbo speed value. Once the turbo speed value is above a threshold value (e.g., 50% of the bandwidth of the filtering modules 214, 216), the control module 202 configures the filtering modules 214, 216 to be centered about one or more preceding turbo speed values, such as, for example, an average of the two most recent preceding turbo speed values with a bandwidth of 25% of the maximum turbo speed value. In this regard, the pass band bandwidth represents the range of likely or feasible speeds for the turbocharger 101 based on its preceding speeds. However, upon initialization or when turbo speed values are below the threshold value, the control module 202 configures the filtering modules 214, 216 as a low pass filter having the desired pass band bandwidth. In this manner, pass band of the filtering modules 214, 216 is adaptive to dynamically reflect the most preceding turbo speed values.

The turbo speed monitoring process 300 continues by performing frequency analysis on the filtered measurement values to identify peak frequency components corresponding to the measured rotational speed of the turbocharger by the respective sensing arrangement (task 308). For example, the speed determination block 222 analyzes the filtered FFT of the accelerometer output and identifies the frequency component having the peak amplitude as the current accelerometer measurement of the turbo speed. Similarly, the speed determination block 222 analyzes the filtered FFT of the microphone output and identifies the frequency component having the peak amplitude as the current acoustic measurement of the turbo speed.

After determining the current accelerometer turbo speed value and the current acoustic turbo speed value, the turbo speed monitoring process 300 continues by determining the current turbo speed measurement value based on the relative stabilities of the accelerometer and acoustic turbo speed values (task 310). In this regard, the turbo speed monitoring process 300 determines which of the current accelerometer turbo speed value and the current acoustic turbo speed value most accurately quantifies the actual rotational speed of the turbocharger, as described in greater detail below in the context of FIG. 4. In exemplary embodiments, the speed determination module 222 preferentially identifies the current accelerometer turbo speed value as the current turbo speed measurement value when the current accelerometer turbo speed value is substantially stable due to the mechanical coupling between the accelerometer 208 and the compressor 112 or other component of the turbocharger 101 via the physical mounting of the accelerometer 208 to the substrate 201, which, in turn, is physically coupled to the turbocharger 101. When the accelerometer turbo speed value is deemed unstable, the speed determination module 222 identifies the current acoustic turbo speed value as the current turbo speed measurement value when the current acoustic turbo speed value is substantially stable. When neither of the sensor speed values is stable, the speed determination module 222 determines an estimated speed value based on the most stable of the sensor speed values. For example, in exemplary embodiments, the speed determination module 222 utilizes a Kalman filter to determine an estimated turbo speed value as a function of the preceding sensor speed value for the most stable of the sensor speed values. In one or more embodiments, the speed determination module 222 utilizes one or more environmental sensors 212 to exclude one of the sensor speed values from the analysis. For example, when the current temperature exceeds the upper limit of the operating range for the accelerometer 208, the accelerometer turbo speed value may be excluded from consideration so that the speed determination module 222 either determines the acoustic turbo speed value should be utilized as the turbo speed measurement value if stable and otherwise determines an estimated turbo speed value using the preceding acoustic turbo speed value.

Still referring to FIG. 3, after determining the current turbo speed measurement value for the current iteration of the turbo speed monitoring process 300, the turbo speed monitoring process 300 outputs or otherwise provides the current turbo speed measurement value to a client device for further analysis or presentation and stores or otherwise maintains the current turbo speed measurement value along with the current sensor speed values (tasks 312, 314). In this regard, the current turbo speed measurement value determined by the speed determination module 222 is provided to the communications interface 206, which, in turn, transmits or otherwise communicates the current turbo speed measurement value to the client device 122 via the network 124. The client device 122 may generate one or more graphical user interface (GUI) displays that include graphical representations of the current turbo speed measurement value and/or one or more preceding turbo speed measurement values, such as, for example, a graph of the turbo speed measurement values output by the turbo speed sensor 120, 200. Additionally, the control module 202 stores or otherwise maintains that current turbo speed measurement value in memory 204 for use in adaptively configuring the filtering modules 214, 216 while also storing or maintaining the current accelerometer speed value and the current acoustic speed value for use in determining whether subsequent speed values are substantially stable. The loop defined by tasks 304, 306, 308, 310, 312 and 314 may repeat as desired throughout operation of the turbocharger system 100 to continually monitor and update the value for the rotational speed of the turbocharger 101 substantially in real-time.

Figure 4:
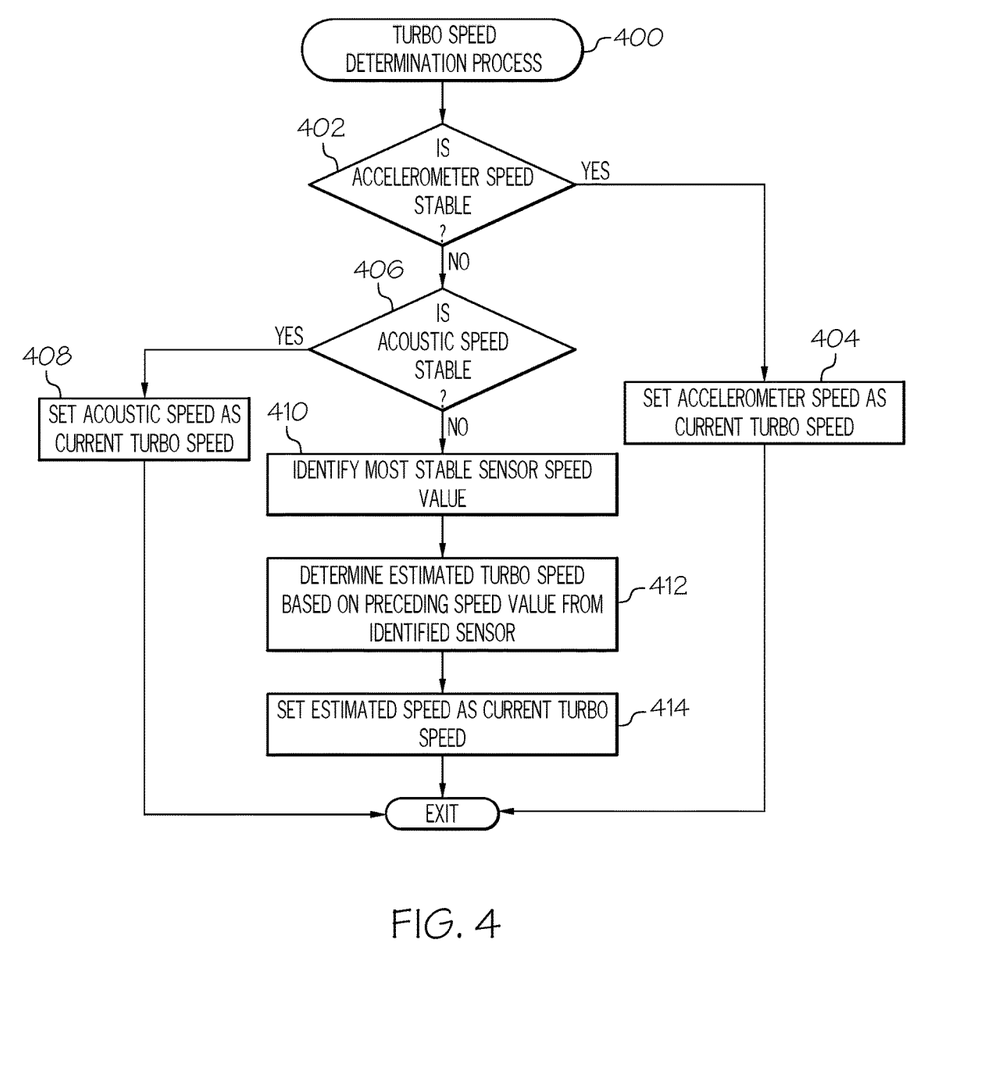
FIG. 4 is a flow diagram of an exemplary turbo speed determination process suitable for implementation in conjunction with the turbo speed monitoring process of FIG. 3 in accordance with one or more exemplary embodiments.

Referring now to FIG. 4, and with continued reference to FIGS. 1-3, in an exemplary embodiment, a turbo speed sensor 120, 200 in a turbocharger system 100 is configured to perform a turbo speed determination process 400 and additional tasks, functions, and operations described below to determine a current measurement representative of the current rotational speed associated with a turbocharger 101. In exemplary embodiments, the turbo speed determination process 400 is implemented by the speed determination module 222 of the turbo speed sensor 120, 200 in conjunction with the turbo speed monitoring process 300 of FIG. 3. Again, it should be noted that practical embodiments of the turbo speed determination process 400 may include any number of additional or alternative tasks, the tasks need not be performed in the illustrated order and/or the tasks may be performed concurrently, and/or one or more of the tasks shown and described in the context of FIG. 4 could be omitted from a practical embodiment of the turbo speed determination process 400 as long as the intended overall functionality remains intact.

The illustrated turbo speed determination process 400 begins by analyzing the accelerometer turbo speed value to verify or otherwise determine whether the accelerometer turbo speed is stable, and when the accelerometer turbo speed is stable, the turbo speed determination process 400 sets the current turbo speed measurement value to be equal to the current accelerometer speed value (tasks 402, 404). In exemplary embodiments, the speed determination module 222 compares the current accelerometer turbo speed value to the preceding accelerometer turbo speed value stored in memory 204 to determine whether the difference between successive accelerometer turbo speed values is less than a stability threshold value. In some embodiments, the speed determination module 222 also verifies the absence of any environmental conditions detectable via the auxiliary sensing arrangements 212 that could degrade or impact reliability of the accelerometer turbo speed value, thereby verifying that the accelerometer turbo speed value is both stable and reliable. In this regard, in response to detecting such an environmental condition that could impact reliability of the accelerometer turbo speed value, the turbo speed determination process 400 may proceed (e.g., to task 406) regardless of the stability of the accelerometer turbo speed, thereby excluding or otherwise preventing the accelerometer turbo speed value from being utilized as the current turbo speed value.

When the difference between the current accelerometer turbo speed value and the preceding accelerometer turbo speed value is less than the stability threshold value and no environmental conditions exist that would make the accelerometer turbo speed value unreliable, the speed determination module 222 determines the accelerometer turbo speed is stable and outputs the current accelerometer turbo speed value as the current turbo speed measurement value via the communications interface 206. The speed determination module 222 also stores the current accelerometer turbo speed value as the most recent turbo speed measurement value in the memory 204, which, in turn is utilized to adaptively tune the filtering modules 214, 216 for the next iteration of the turbo speed monitoring process 300 as described above.

When the accelerometer turbo speed is not substantially stable, or when an environmental condition exists that makes the accelerometer turbo speed unreliable, the turbo speed determination process 400 continues by analyzing the acoustic turbo speed value to verify or otherwise determine whether the acoustic turbo speed is stable, and when the acoustic turbo speed is stable, the turbo speed determination process 400 sets the current turbo speed measurement value to be equal to the current acoustic speed value (tasks 406, 408). In exemplary embodiments, the speed determination module 222 compares the current acoustic turbo speed value to the preceding acoustic turbo speed value stored in memory 204 to determine whether the difference between successive acoustic turbo speed values is less than a stability threshold value, which may be equal to or different than that utilized to assess the stability of the accelerometer turbo speed value. Additionally, in some embodiments, the speed determination module 222 also verifies the absence of any environmental conditions that could degrade or impact reliability of the acoustic turbo speed value, thereby verifying that the acoustic turbo speed value is both stable and reliable. When the speed determination module 222 determines the acoustic turbo speed is stable and reliable, the speed determination module 222 outputs the current acoustic turbo speed value as the current turbo speed measurement value via the communications interface 206. The speed determination module 222 also stores the current acoustic turbo speed value as the most recent turbo speed measurement value in the memory 204 for adaptively tuning the filtering modules 214, 216 for the next iteration of the turbo speed monitoring process 300.

When the turbo speed determination process 400 determines that neither sensor speed value is sufficiently stable and reliable, the turbo speed determination process 400 continues by identifying or otherwise determining which of the sensors is most stable (task 410). In exemplary embodiments, the speed determination module 222 identifies which sensing arrangement 208, 210 is currently most stable by determining which of the sensor speed values has the smallest difference relative to its preceding value. For example, in one embodiment, the speed determination module 222 subtracts the previous accelerometer speed value from memory 204 from the current accelerometer speed value to obtain an accelerometer speed difference, subtracts the previous acoustic speed value from memory 204 from the current acoustic speed value from to obtain an acoustic speed difference, and then identifies the lesser of the accelerometer speed difference and the acoustic speed difference as corresponding to the more stable of the sensor speed values. In yet other embodiments, the speed determination module 222 may divide the accelerometer speed difference by the preceding accelerometer speed value to obtain an accelerometer speed percentage difference, divide the acoustic speed difference by the preceding acoustic speed value to obtain an acoustic speed percentage difference, and then identify the lesser of the accelerometer speed percentage difference and the acoustic speed percentage difference as corresponding to the more stable of the sensor speed values. In this regard, it should be appreciated there are numerous metrics or statistics that could be utilized to assign a relative stability to the respective sensor speed values and the subject matter described herein is not limited to any particular metric or statistic.

The turbo speed determination process 400 continues by calculating or otherwise determining an estimated turbo speed value as a function of one or more preceding turbo speed values from the sensor identified as being most stable and sets the estimated value as the current turbo speed value (tasks 412, 414). In exemplary embodiments, the speed determination module 222 implements a Kalman filter to calculate an estimated turbo speed value as a function of the preceding turbo speed value from the sensor identified as being most stable and the current turbo speed value from that sensor. For example, the speed determination module 222 may calculate an estimated speed measurement for the respective sensor as a function of its preceding speed value using a Kalman filter and then output that estimated speed measurement value in lieu of the current turbo speed value from that sensor. It should be noted that there are numerous different implementations for Kalman filters and numerous alternative manners for determining an estimated value, and the subject matter is not limited to any particular approach for determining an estimated turbo speed value. For example, any number of preceding turbo speed values for a given sensor may be stored and maintained and then analyzed to project or estimate a future value using a trend line, curve fitting, or another extrapolation technique.

In alternative embodiments of the process 400, rather than employing a Kalman filter, the speed determination module 222 calculates the estimated turbo speed value as a weighted average of the accelerometer turbo speed value and the acoustic turbo speed value. In this regard, in some embodiments, the weights assigned to the respective values may correspond to their relative stabilities and dynamically and adaptively change with each iteration or update of the process 400 to transition from outputting a current turbo speed value that is predominantly based on the accelerometer turbo speed value to a turbo speed value that is predominantly based on the acoustic turbo speed value. In this regard, there are numerous other techniques for filtering or otherwise combining values according to their relative reliabilities or accuracies to achieve a representative value biased or skewed toward the more reliable or accurate of the values, and the subject matter described herein is not necessarily limited to Kalman filters, weighted averages, or any particular technique. For example, in some embodiments, the speed determination module 222 may simply average the accelerometer turbo speed value and the acoustic turbo speed value to obtain the estimated turbo speed value until one of the accelerometer turbo speed value and the acoustic turbo speed value is sufficiently stable.

Figure 5:
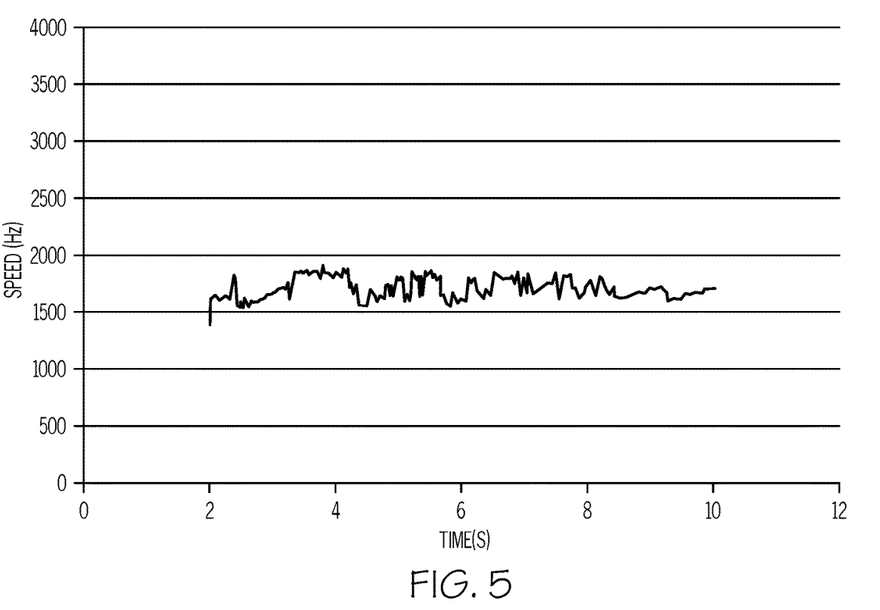
FIG. 5 is a graph depicting an exemplary relationship between accelerometer turbo speed values and time in accordance with one embodiment of the turbo speed determination process of FIG. 4.
Figure 6:
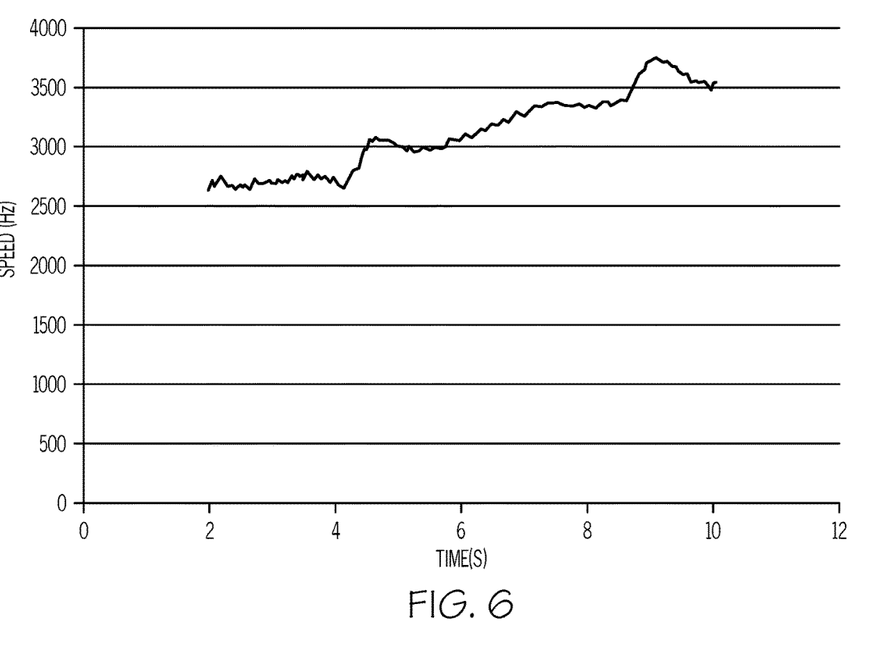
FIG. 6 is a graph depicting an exemplary relationship between acoustic turbo speed values and time corresponding to the relationship between accelerometer turbo speed values and time of FIG. 5 in accordance with one embodiment of the turbo speed determination process of FIG. 4.
Figure 7:
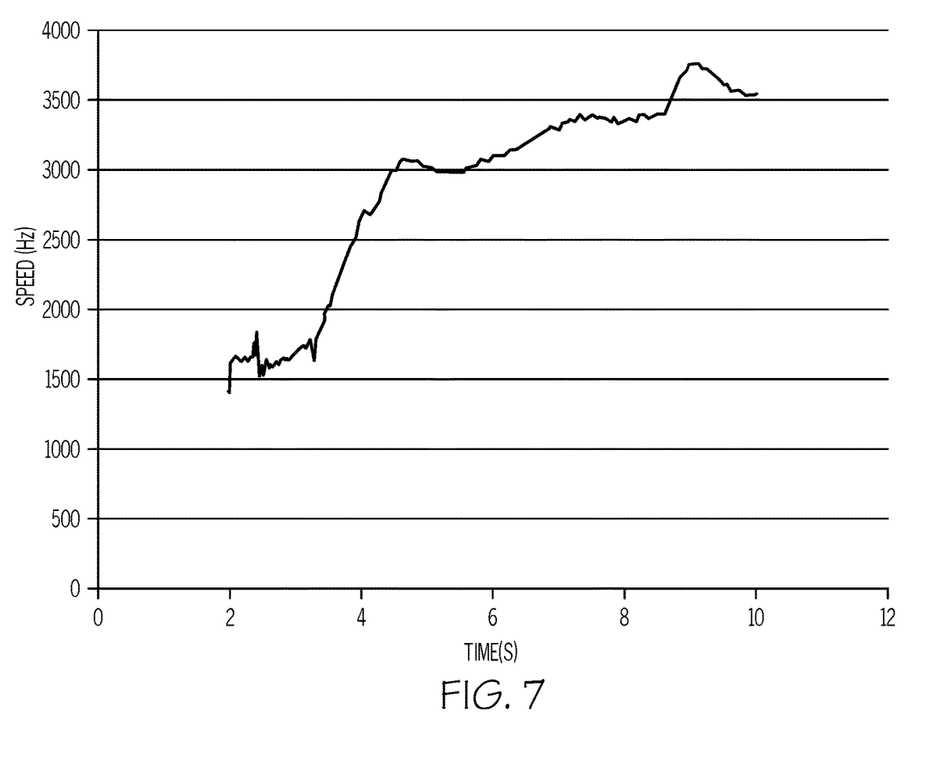
FIG. 7 is a graph depicting an exemplary relationship between the turbo speed output by the turbo speed determination process of FIG. 4 with respect to time in accordance with the embodiment depicted in FIGS. 5-6.

As described above in the context of FIGS. 1-3, the resulting value set by the turbo speed determination process 400 as the current turbo speed measurement value may be output by the turbo speed sensor 120, 200 to the client device 122 for display and diagnostics analysis, while also being stored or maintained by the turbo speed sensor 120, 200 for adaptively determining the next turbo speed measurement value as described above. In this regard, FIG. 7 depicts an exemplary graphical representation of the turbo speed output by the turbo speed sensor 120, 200 on a client device 122, with FIG. 5 depicting a graphical representation of the underlying accelerometer turbo speed values and FIG. 6 depicting a graphical representation of the underlying acoustic turbo speed values. In the illustrated embodiment, the accelerometer turbo speed values are more stable and reliable at lower speeds and the acoustic turbo speed values are more stable and reliable at higher speeds, so that the turbo speed determination process 400 results in the speed determination module 222 outputting the accelerometer turbo speed values from the accelerometer 208 as the turbo speed measurement value (and the client device 122 displaying the accelerometer turbo speed values in FIG. 7) upon startup until reaching a speed where the stability of the accelerometer turbo speed values falls below the stability threshold (around 1800 Hz in the illustrated example of FIGS. 5-7).

As the speed of the turbocharger 101 increases above that transition speed, the turbo speed determination process 400 tends to result in the speed determination module 222 outputting an estimated turbo speed measurement until the acoustic turbo speed values are stable (between 2500 Hz and 4000 Hz in the illustrated example of FIGS. 5-7), at which point the speed determination module 222 tends to output the acoustic turbo speed value from the microphone 210 as the turbo speed measurement value (and the client device 122 displaying the accelerometer turbo speed values in FIG. 7). As the speed of the turbocharger 101 eventually begins to drop, the output of the speed determination module 222 and the corresponding display on the client device 122 may similarly transition from the acoustic turbo speed value to the accelerometer turbo speed value. That said, during instances where the accelerometer turbo speed is stable at higher speeds, the accelerometer turbo speed value may be output as the current turbo speed measurement value by virtue of the accelerometer turbo speed value being more likely to represent the actual rotational speed via the physical coupling to the compressor 112 or other components of the turbocharger 101. As the rotational speed falls, the speed determination module 222 and/or the turbo speed determination process 400 may similarly transition to outputting an estimated turbo speed measurement based on the acoustic turbo speed value, outputting an estimated turbo speed measurement based on the accelerometer turbo speed value, and then outputting the accelerometer turbo speed value once the accelerometer turbo speed is stable again.

By virtue of the subject matter described herein, as the turbo speed the most stable turbo speed measurement value may be utilized for display or diagnostics, with an estimation algorithm such as a Kalman filter being employed to provide a reliable estimate of the current turbo speed when the direct sensor measurement values are not substantially stable. The resulting turbo speed measurement value can also be utilized to dynamically adapt the filtering and other signal processing to improve accuracy and reliability of subsequent measurements. Utilizing MEMS technology allows for different sensors to be packaged together in a compact form factor that facilitates nondestructive installation without modification of the turbocharger or other under-the-hood components at a relatively low cost. Additionally, auxiliary sensors can be incorporated to dynamically exclude one or more sensor speed measurement values for consideration according to environmental conditions, thereby ensuring that a potentially unreliable sensor speed measurement value is not ultimately displayed or utilized for diagnostics.

For the sake of brevity, conventional techniques related to turbocharger systems, sensing, sampling, filtering, signal processing, Fourier transforms and frequency analysis, Kalman filters, MEMS, device packaging, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The subject matter may be described herein in terms of functional and/or logical block components, and with reference to symbolic representations of operations, processing tasks, and functions that may be performed by various computing components or devices. It should be appreciated that the various block components shown in the figures may be realized by any number of hardware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices. Furthermore, embodiments of the subject matter described herein can be stored on, encoded on, or otherwise embodied by any suitable non-transitory computer-readable medium as computer-executable instructions or data stored thereon that, when executed (e.g., by a processing system), facilitate the processes described above.

The foregoing description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements, additional intervening elements, devices, features, or components may be present in an embodiment of the depicted subject matter. In addition, certain terminology may also be used in the description for the purpose of reference only, and thus is not intended to be limiting. For example, the terms "first," "second," and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any theory presented in the preceding background, brief summary, or the detailed description.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

What is claimed is:

1. A system comprising:
   a turbocharger arrangement; and
   a speed sensing device mounted to the turbocharger arrangement, wherein the speed sensing device includes:
   an acceleration sensing arrangement;
   an acoustic sensing arrangement;
   a communications interface to output a current speed value; and
   a control module coupled to the acceleration sensing arrangement, the acoustic sensing arrangement and the communications interface to provide an acceleration speed value to the communications interface as the current speed value when the acceleration speed value is stable, provide an acoustic speed value to the communications interface as the current speed value when the acceleration speed value is unstable and the acoustic speed value is stable, and provide an estimated speed value to the communications interface as the current speed value when both the acceleration speed value and the acoustic speed value are unstable.

2. The system of claim 1, the acceleration sensing arrangement providing measured acceleration output signals to the control module and the acoustic sensing arrangement providing measured acoustic output signals to the control module, wherein the control module determines the acceleration speed value based at least in part on the measured acceleration output signals and determines the acoustic speed value based at least in part on the measured acoustic output signals.

3. The system of claim 1, wherein the control module adaptively filters the measured acceleration output signals and the measured acoustic output signals based at least in part on the current speed value.

4. The system of claim 1, wherein:
   the acceleration sensing arrangement comprises a microelectromechanical system (MEMS) accelerometer; and
   the acoustic sensing arrangement comprises a MEMS microphone.

5. The system of claim 1, wherein:
   the turbocharger arrangement includes a compressor coupled to a turbine; and
   the speed sensing device is mounted to the compressor.

6. The system of claim 1, the control module identifying one of the acceleration speed value and the acoustic speed value as more stable, wherein the estimated speed value is determined based on the more stable of the acceleration speed value and the acoustic speed value.

7. The system of claim 1, wherein:
   the speed sensing device further comprises a data storage element coupled to the control module to store a preceding acceleration speed value and a preceding acoustic speed value; and
   the estimated speed value is based at least in part on one of the preceding acceleration speed value and the preceding acoustic speed value.

8. A speed sensing device comprising:
   a substrate;
   an acceleration sensing arrangement to output measured acceleration output signals, the acceleration sensing arrangement being disposed on the substrate;
   an acoustic sensing arrangement to output measured acoustic output signals, the acoustic sensing arrangement being disposed on the substrate;
   a communications interface;
   a control module coupled to the acceleration sensing arrangement, the acoustic sensing arrangement and the communications interface to:
   determine an acceleration speed value based at least in part on the measured acceleration output signals;
   determine an acoustic speed value based at least in part on the measured acoustic output signals;
   provide the acceleration speed value to the communications interface for output as a current speed value when the acceleration speed value is stable;
   provide the acoustic speed value to the communications interface for output as the current speed value when the acceleration speed value is unstable and the acoustic speed value is stable; and
   provide an estimated speed value to the communications interface for output as the current speed value when both the acceleration speed value and the acoustic speed value are unstable.

9. The speed sensing device of claim 8, wherein the communications interface and the control module are mounted on the substrate.

10. The speed sensing device of claim 8, further comprising a data storage element coupled to the control module to store a preceding acceleration speed value and a preceding acoustic speed value, wherein the estimated speed value is based at least in part on one of the preceding acceleration speed value and the preceding acoustic speed value.

11. The speed sensing device of claim 8, wherein the control module filters the measured acceleration output signals and the measured acoustic output signals based at least in part on the current speed value.

12. The speed sensing device of claim 8, further comprising a third sensing arrangement on the substrate to provide signals indicative of an environmental condition, wherein the control module is coupled to the third sensing arrangement to detect the environmental condition and exclude one of the acceleration speed value and the acoustic speed value for output as the current speed value in response to detecting the environmental condition.

13. A method of determining a rotational speed associated with a turbocharger, the method comprising:
 determining, by a control module of a device mounted to the turbocharger, a first speed value based on first output signals from an acceleration sensing arrangement of the device;
 determining, by the control module, a second speed value based on second output signals from an acoustic sensing arrangement of the device;
 outputting, by the control module via a communications interface of the device, the first speed value as the rotational speed when the first speed value is stable; and
 when the first speed value is unstable:
  outputting, by the control module via the communications interface, the second speed value as the rotational speed when the second speed value is stable; and
  outputting, by the control module via the communications interface, an estimated value as the rotational speed when the second speed value is unstable.

14. The method of claim 13, further comprising:
 determining the first speed value is stable when a first difference between the first speed value and a preceding speed value determined based on the first output signals is less than a first threshold; and
 determining the second speed value is stable when a second difference between the second speed value and a preceding speed value determined based on the second output signals is less than a second threshold; and
 determining the estimated value comprises:
  determining the estimated value based at least in part on the preceding speed value determined based on the first output signals when the first difference is less than the second difference; and
  determining the estimated value based at least in part on the preceding speed value determined based on the second output signals when the second difference is less than the first difference.

15. The method of claim 13, further comprising:
 adaptively filtering the first output signals based at least in part on the rotational speed prior to determining the first speed value; and
 adaptively filtering the second output signals based at least in part on the rotational speed prior to determining the second speed value.

16. The method of claim 15, further comprising receiving, by the control module via the communications interface, a maximum rotational speed reference value from a client device, wherein the control module adaptively filters the first and second output signals based at least in part on the rotational speed and the maximum rotational speed reference value.

17. The method of claim 13, wherein:
 the acceleration sensing arrangement comprises a microelectromechanical system (MEMS) accelerometer;
 the acoustic sensing arrangement comprises a MEMS microphone; and
 the MEMS accelerometer and the MEMS microphone are provided on a common substrate.

18. The method of claim 13, further comprising obtaining, by the control module from a third sensing arrangement of the device, signals indicative of an environmental condition, wherein outputting the first speed value comprises outputting the first speed value as the rotational speed when the first speed value is stable in the absence of the environmental condition.

19. The method of claim 18, further comprising preventing outputting the first speed value as the rotational speed in response to detecting the environmental condition.

20. A computer-readable medium having instructions stored thereon that are executable by the control module of the device to perform the method of claim 13.

* * * * *